United States Patent
Otake et al.

(10) Patent No.: US 7,391,069 B2
(45) Date of Patent: Jun. 24, 2008

(54) SEMICONDUCTOR DEVICE AND MANUFACTURING METHOD THEREOF

(75) Inventors: Seiji Otake, Saitama (JP); Ryo Kanda, Gunma (JP); Shuichi Kikuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 68 days.

(21) Appl. No.: 11/504,443

(22) Filed: Aug. 14, 2006

(65) Prior Publication Data
US 2007/0052016 A1 Mar. 8, 2007

(30) Foreign Application Priority Data
Aug. 31, 2005 (JP) ............... 2005-250499

(51) Int. Cl.
*H01L 29/78* (2006.01)
*H01L 23/58* (2006.01)

(52) U.S. Cl. .................. 257/288; 257/356; 257/372

(58) Field of Classification Search ............. 257/288, 257/286, 287, 331, 338, 334, 355, 356, 372; 359/59
See application file for complete search history.

(56) References Cited

U.S. PATENT DOCUMENTS 6,927,452 B2 * 8/2005 Shin et al. .................. 257/335

FOREIGN PATENT DOCUMENTS

| JP | 09-139438 | 5/1997 |
|---|---|---|
| JP | 2001-119019 | 4/2001 |
| JP | 2002-026328 | 1/2002 |

* cited by examiner

*Primary Examiner*—Marvin M. Lateef
*Assistant Examiner*—William A. Harriston
(74) *Attorney, Agent, or Firm*—Fish & Richardson P.C.

(57) ABSTRACT

In a conventional semiconductor device, for example, a MOS transistor, there is a problem that a parasitic transistor is prone to be operated due to an impurity concentration in a back gate region and a shape of diffusion thereof. In a semiconductor device of the present invention, for example, a MOS transistor, a P type diffusion layer 5 as the back gate region, and an N type diffusion layer 8 as a drain region, are formed in an N type epitaxial layer 4. In the P type diffusion layer 5, an N type diffusion layer 7 as a source region and a P type diffusion layer 6 are formed. The P type diffusion layer 6 is formed by performing ion implantation twice so as to correspond to a shape of a contact hole 15. Moreover, impurity concentrations in surface and deep portions of the P type diffusion layer 6 are controlled. By use of this structure, a device size is reduced, and an operation of a parasitic NPN transistor is suppressed.

3 Claims, 5 Drawing Sheets

SEMICONDUCTOR DEVICE AND MANUFACTURING METHOD THEREOF

Priority is claimed to Japanese Patent Application Number JP2005-250499 filed on Aug. 31, 2005, the disclosure of which is incorporated herein by reference in its entirety.

BACKGROUND OF THE INVENTION

1. Field of the Invention

The present invention relates to a semiconductor device which realizes reduction in a device size and prevents an operation of a parasitic transistor, and a manufacturing method thereof.

2. Description of the Related Art

In a conventional semiconductor device, an N type drain well region and a P type back gate region are formed on a surface of a silicon substrate. Moreover, in the drain well region, a high-concentration N type drain region is formed. Meanwhile, in the back gate region, an N type source region is formed. On the surface of the silicon substrate between the drain region and the source region, a gate electrode is formed. Furthermore, in the back gate region, a P type diffusion layer connected to a source electrode is formed. Thus, an N-channel MOSFET is formed. By use of this structure, the back gate region and the source region are maintained to have the same potential. Thus, an operation of a parasitic NPN transistor is suppressed. This technology is described for instance in Japanese Patent Application Publication No. 2001-119019, pp. 6 to 7 and FIGS. 1 to 3.

In a conventional method for manufacturing a semiconductor device, an N type diffusion layer used as a drain region, a P type diffusion layer used as a back gate region, and an N type diffusion layer used as a source region are formed by ion implantation after an oxide film is formed on a substrate surface in a MOSFET formation region. Thereafter, depending on the need, in the P type diffusion layer used as the back gate region and the N type diffusion layer used as the source region, a P type diffusion layer connected to the source electrode are formed by ion implantation. Subsequently, the source electrode is formed so as to be connected to the N type diffusion layer used as the source region and the P type diffusion layer used as the back gate region. As a result, the P type diffusion layer used as the back gate region and the N type diffusion layer used as the source region are set to have the same potential. Thus, the operation of the parasitic NPN transistor is suppressed. This technology is described for instance in Japanese Patent Application Publication No. Hei 9 (1997)-139438, pp. 5 to 6 and FIGS. 4 to 6.

As described above, in the conventional semiconductor device, a contact hole for the source electrode is formed after the source region and the P type diffusion layer which suppresses the operation of the parasitic transistor are formed in the back gate region. Thus, the source electrode is connected to the P type diffusion layer and the source region through the contact hole. By use of this structure, when the contact hole is formed, mask misalignment at the time of formation of the P type diffusion layer and mask misalignment at the time of formation of the contact hole are taken into consideration. Thus, a width of the contact hole is increased. As a result, there is a problem that it is difficult to reduce a device size.

Moreover, in the conventional semiconductor device, the P type diffusion layer is formed in the back gate region in order to suppress the operation of the parasitic NPN transistor in the N-channel MOSFET device. However, since the P type diffusion layer is formed by a thermal diffusion step, a formation region in a deep portion of the back gate region is reduced. By use of this structure, there is a problem that it is difficult to reduce a resistance value in the deep portion of the back gate region and to suppress the operation of the parasitic NPN transistor. Meanwhile, in the case where the P type diffusion layer is formed across a large area in the deep portion of the back gate region, thermal diffusion time is increased. Thus, it is required to take account of lateral diffusion. In this case, there is a problem that the device size is increased more than necessary.

Furthermore, in the conventional method for manufacturing the semiconductor device, the P type diffusion layer is formed in the back gate region in order to suppress the operation of the parasitic NPN transistor in the N-channel MOSFET device. In this event, in order to reduce a resistance value of the back gate region and to reduce a base resistance value of the parasitic NPN transistor, a P type diffusion layer having a high impurity concentration is formed. However, mask misalignment at the time of formation of the P type diffusion layer may cause the P type diffusion layer to be formed in a region where a channel is formed below the gate electrode. In this case, the operation of the parasitic NPN transistor can be suppressed. However, there is a problem that a threshold (Vth) of the MOSFET is modulated.

In addition, in the conventional method for manufacturing the semiconductor device, after the back gate region of the MOSFET is formed in the silicon substrate and the source region and the P type diffusion layers of the MOSFET are formed in the back gate region of the silicon substrate, an insulating layer is formed on the silicon substrate. Subsequently, after contact holes are formed in the insulating layer by use of a heretofore known photolithography technology, the source electrode and the like are formed. By use of this manufacturing method, when the contact hole for the source electrode is formed, it is required to take account of mask misalignment at the time of formation of the P type diffusion layers in addition to mask misalignment with respect to the P type diffusion layers. For this reason, the width of the contact hole for the source electrode is increased. As a result, there is a problem that it is difficult to reduce the device size.

SUMMARY OF THE INVENTION

The present invention was made in consideration for the foregoing problems. A semiconductor device of the present invention includes a semiconductor layer, a drain region, a source region and a back gate region, which are formed in the semiconductor layer, a gate oxide film formed on the semiconductor layer, a gate electrode formed on the gate oxide film, an insulating layer formed on the semiconductor layer, and a contact hole formed in the insulating layer on any of the drain region, the source region and the gate electrode. In the semiconductor device, a back gate draw-out region is formed in the back gate region, and the back gate draw-out region is formed in a portion deeper than the source region. Moreover, the back gate draw-out region positioned deeper than the source region is formed across a whole opening region of the contact hole at least on the source region. Therefore, in the present invention, the back gate draw-out region is also formed below the source region. By use of this structure, a resistance value in a deep portion of the back gate region is reduced. Thus, an operation of a parasitic transistor can be suppressed.

Moreover, in the semiconductor device of the present invention, as for the back gate draw-out region, the region positioned deeper than the source region is formed across a wider region than a region surrounded by the source region. Therefore, in the present invention, the resistance value in the deep portion of the back gate region can be reduced while reducing contact resistance. By use of this structure, a shape of a contact hole for a source electrode is miniaturized. Thus, a device size can be reduced.

Furthermore, a method for manufacturing the semiconductor device according to the present invention includes the steps of forming a back gate region and a drain region in a semiconductor layer, forming a gate oxide film and a gate electrode on the semiconductor layer, performing ion implantation in a state where a desired region of the back gate region is covered with a resist mask, and forming a source region, forming an insulating layer on the semiconductor layer, forming contact holes in the insulating layer, and forming the resist mask on the insulating layer so as to provide an opening of the contact hole positioned on the back gate region, and performing ion implantation in the back gate region through the contact hole, and forming a back gate draw-out region in the region from which the resist mask on the back gate region is removed. Therefore, in the present invention, after the contact hole for the source electrode is formed, the back gate draw-out region is formed by utilizing the contact hole. By use of this manufacturing method, a shape of the contact hole for the source electrode can be reduced, and a device size can be reduced.

Moreover, in the method for manufacturing the semiconductor device according to the present invention, in the step of forming the back gate draw-out region, ion implantation is performed twice under different ion implantation conditions for each time. Moreover, a dose of impurities in a first round is larger than a dose of impurities in a second round. Therefore, in the present invention, the back gate draw-out region is formed by using the insulating layer as a mask and utilizing the contact hole for the source electrode. By use of this manufacturing method, channeling attributable to the second round of ion implantation can be suppressed.

Moreover, in the method for manufacturing the semiconductor device according to the present invention, in the step of forming the back gate draw-out region, the dose of impurities in the first round is set to meet a condition in which a region where the back gate draw-out region and the source region overlap with each other becomes the source region. Therefore, in the present invention, the back gate draw-out region is formed for the back gate region surrounded by the source region. By use of this manufacturing method, after the contact hole for the source electrode is formed, the back gate draw-out region can be formed by utilizing the contact hole.

In addition, in the method for manufacturing the semiconductor device according to the present invention, in the step of forming the back gate draw-out region, an acceleration voltage in the first round is set to meet a condition in which impurities do not penetrate the source region. Therefore, in the present invention, by reducing the acceleration voltage in the first round of ion implantation, channeling attributable to the first round of ion implantation can be reduced.

Moreover, in the method for manufacturing the semiconductor device according to the present invention, in the step of forming the back gate draw-out region, the acceleration voltage in the second round is set to meet a condition in which impurities penetrate the source region. Moreover, the back gate draw-out region is formed into a shape of the opening of the contact hole in a portion deeper than the source region. Therefore, in the present invention, by forming the back gate draw-out region in the portion deeper than the source region, the operation of the parasitic transistor can be suppressed.

In the present invention, the back gate draw-out region is formed in the portion deeper than the source region so as to correspond to the shape of the opening of the contact hole for the source electrode in the back gate region. By use of this structure, the resistance value in the back gate region can be reduced and the operation of the parasitic transistor can be suppressed.

Moreover, in the present invention, the back gate draw-out region is formed so as to correspond to the shape of the opening of the contact hole for the source electrode. By use of this structure, the shape of the contact hole for the source electrode can be miniaturized and the device size can be reduced.

Moreover, in the present invention, the back gate draw-out region is formed by utilizing the contact hole formed in the insulating layer after the source region is circularly formed. By use of this manufacturing method, it is not required to take account of mask misalignment at the time of formation of the back gate draw-out region and mask misalignment at the time of formation of the contact hole for the source electrode. As a result, the shape of the contact hole for the source electrode can be miniaturized and the device size can be reduced.

Furthermore, in the present invention, the back gate draw-out region is formed by performing the ion implantation twice, using the insulating layer as a mask. Moreover, the dose of impurities in the first round is larger than the dose of impurities in the second round. By use of this manufacturing method, even if the second round of ion implantation is performed at a high acceleration voltage, the channeling can be suppressed.

In addition, in the present invention, at the time of formation of the back gate draw-out region, the acceleration voltage in the second round of ion implantation is set to meet a condition in which impurities are formed in a portion deeper than the source region. By use of this manufacturing method, the back gate draw-out region can be formed in the portion deeper than the source region so as to correspond to the shape of the opening of the contact hole for the source electrode. Therefore, the resistance value in the back gate region can be reduced and the operation of the parasitic transistor can be suppressed.

DESCRIPTION OF THE EMBODIMENTS

Figure 1A:
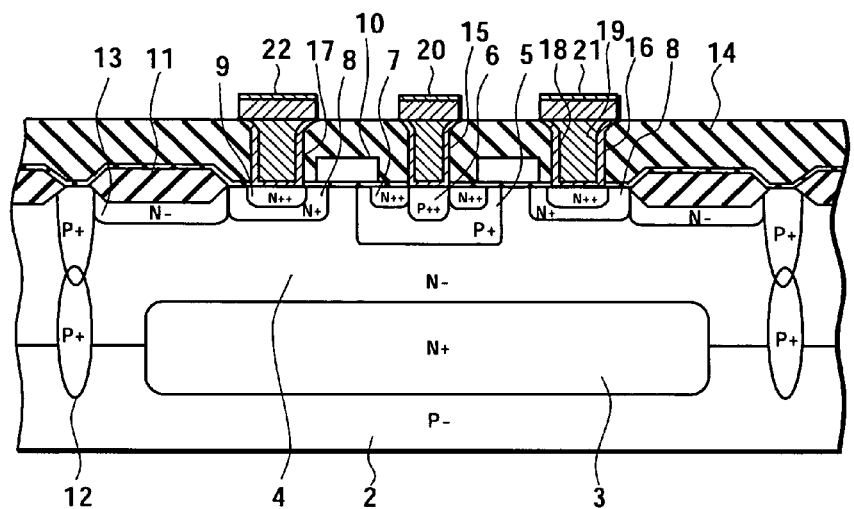
FIG. 1A is a cross-sectional view.
Figure 1B:
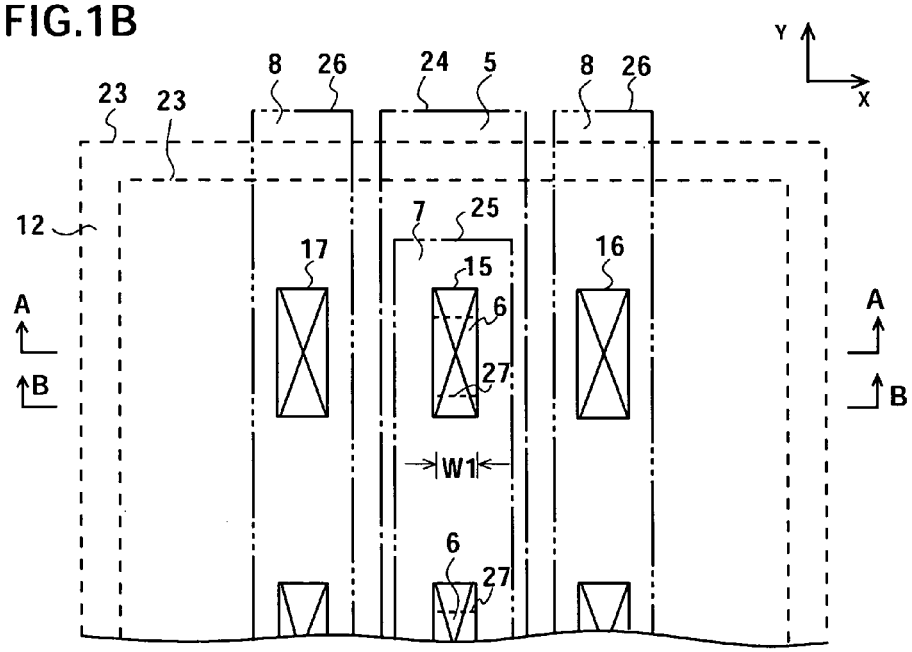
FIG. 1B is a plan view, showing a semiconductor device according to an embodiment of the present invention.
Figure 2:
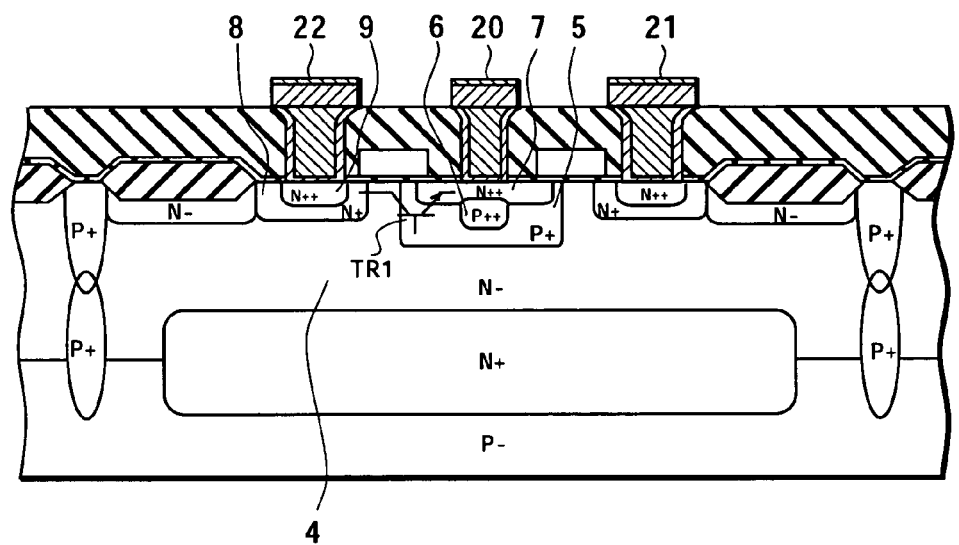
FIG. 2 is a cross-sectional view showing the semiconductor device according to the embodiment of the present invention.

With reference to FIGS. 1 and 2, a semiconductor device according to an embodiment of the present invention will be described in detail below. FIG. 1A is a cross-sectional view and FIG. 1B is a plan view showing a semiconductor device of this embodiment. FIG. 2 is a cross-sectional view showing the semiconductor device according to this embodiment.

As shown in FIG. 1A, an N-channel MOS transistor 1 mainly includes a P type single crystal silicon substrate 2, an N type buried diffusion layer 3, an N type epitaxial layer 4, P type diffusion layers 5 and 6 used as back gate regions, an N type diffusion layer 7 used as a source region, N type diffusion layers 8 and 9 used as drain regions, and a gate electrode 10.

The N type epitaxial layer 4 is formed on the P type single crystal silicon substrate 2. In the substrate 2 and the epitaxial layer 4, the N type buried diffusion layer 3 is formed. Note that each of the substrate 2 and the epitaxial layer 4 in this embodiment corresponds to a "semiconductor layer" of the present invention. Although the case where one epitaxial layer 4 is formed on the substrate 2 is described in this embodiment, the present invention is not limited thereto. For example, as the "semiconductor layer" of the embodiment of the present invention, only a substrate may be used or a plurality of epitaxial layers may be laminated on the substrate. Moreover, the substrate may be an N type single crystal silicon substrate or a compound semiconductor substrate.

The P type diffusion layer 5 is formed in the epitaxial layer 4. In the P type diffusion layer 5, the P type diffusion layer 6 is formed so as to overlap with the P type diffusion layer 5. The P type diffusion layer 6 is formed to have a depth of about 1.0 (µm) or less from a surface of the epitaxial layer 4. Moreover, the P type diffusion layers 5 and 6 are used as the back gate regions. Note that the P type diffusion layer 6 in this embodiment corresponds to a "back gate draw-out region" of the present invention.

The N type diffusion layer 7 is formed in the P type diffusion layer 5 and is used as the source region. The N type diffusion layer 7 and the P type diffusion layer 6 are connected to a source electrode, and are set to have the same potential. Moreover, the N type diffusion layer 7 is formed to have a depth of about 1.5 (µm) or less from the surface of the epitaxial layer 4.

The N type diffusion layers 8 and 9 are formed in the epitaxial layer 4 and are used as the drain regions. Moreover, the P type diffusion layer 5 positioned between the N type diffusion layers 7 and 8 below the gate electrode 10 is used as a channel region.

The gate electrode 10 is formed on a gate oxide film. The gate electrode 10 is formed of, for example, a polysilicon film and a tungsten silicon film so as to have a desired thickness.

A LOCOS (Local Oxidation of Silicon) oxide film 11 is formed in the epitaxial layer 4. A flat portion of the LOCOS oxide film 11 has a thickness of, for example, about 3000 to 5000 Å. Below the LOCOS oxide film 11 between the N type diffusion layer 8 and a P type isolation region 12, an N type diffusion layer 13 is formed. The N type diffusion layer 13 prevents inversion of the surface of the epitaxial layer 4.

An insulating layer 14 is formed on the epitaxial layer 4. The insulating layer 14 is formed of a boron phospho silicate glass (BPSG) film, a spin on glass (SOG) film or the like. By use of a heretofore known photolithography technology, contact holes 15, 16 and 17 are formed in the insulating layer 14, for example, by dry etching using $CHF_3+O_2$ gas.

In the contact holes 15, 16 and 17, barrier metal films 18 and tungsten (W) films 19 are buried. On surfaces of the tungsten films 19, aluminum-silicon-copper (AlSiCu) films and barrier metal films are selectively formed. Thus, a source electrode 20 and drain electrodes 21 and 22 are formed. Note that, although a wiring layer for the gate electrode 10 is not shown in the cross-sectional view of FIG. 1A, the electrode is connected to the wiring layer in other regions.

As shown in FIG. 1B, a region surrounded by dotted lines 23 indicates the isolation region 12, a region surrounded by a dashed line 24 indicates the P type diffusion layer 5, a region surrounded by a dashed double-dotted line 25 indicates the N type diffusion layer 7, and regions surrounded by dashed triplicate-dotted lines 26 indicate the N type diffusion layers 8. As shown in FIG. 1B, in a region surrounded by the isolation region 12, the P type diffusion layer 5 and the N type diffusion layers 8 are extended in a Y axis direction shown in FIG. 1B. The N type diffusion layers 8 are formed on both sides of the P type diffusion layer 5 so as to sandwich the P type diffusion layer 5 therebetween. Meanwhile, the N type diffusion layer 7 is formed in the P type diffusion layer 5, and the P type diffusion layers 6 as indicated by dotted lines 27 are formed at certain intervals in the Y axis direction in the N type diffusion layer 7.

The cross-sectional view shown in FIG. 1A is a cross-sectional view along the line A-A in FIG. 1B, and is a region where the P type diffusion layer 6 is exposed on the surface of the epitaxial layer 4. Meanwhile, the cross-sectional view shown in FIG. 2 is a cross-sectional view along the line B-B in FIG. 1B, in which the P type diffusion layer 6 is formed below the N type diffusion layer 7. Described in detail later in description for a method of manufacturing the semiconductor device, the P type diffusion layer 6 is formed by performing ion implantation twice under different conditions for each time, after the contact hole 15 is formed. By use of this manufacturing method, since the P type diffusion layer 6 is formed according to a shape of the contact hole 15, it is not required to take account of mask misalignment with the P type diffusion layer 6 at the time of formation of the contact hole 15. Furthermore, it is not required to take account of mask misalignment at the time of formation of the P type diffusion layer 6. As a result, a width W1 of the contact hole 15 can be reduced, and a size of the MOS transistor 1 can be reduced. Moreover, it is made possible to increase the number of pieces which can be obtained from one wafer.

Furthermore, in the region surrounded by the N type diffusion layer 7, the P type diffusion layer 6 is formed in a region surrounded by the dotted lines 27 (see FIG. 1B). Meanwhile, in a portion deeper than the N type diffusion layer 7, the P type diffusion layer 6 is formed so as to correspond to the shape of an opening of the contact hole 15. Specifically, in the portion deeper than the N type diffusion layer 7, the P type diffusion layer 6 is formed across a region larger than the region surrounded by the N type diffusion layer 7. By use of this structure, a resistance value in the deep portion of the P type diffusion layer 5 is reduced. Thus, an operation of a parasitic transistor in the MOS transistor 1 can be suppressed.

Here, as shown in FIG. 2, a parasitic NPN transistor (TR1) will be described. The parasitic NPN transistor is formed of: a collector region including the N type epitaxial layer 4 and the N type diffusion layers 8 and 9; a base region including the P type diffusion layers 5 and 6; and an emitter region including the N type diffusion layer 7. When the MOS transistor 1 is operated, the P type diffusion layer 6 and the N type diffusion layer 7 are connected to the source electrode, the base region and the emitter region are maintained at the same potential, and the parasitic NPN transistor is not operated. For example, when the MOS transistor 1 is turned off, free carriers (electrons) flowing through an inversion layer (a region where free carriers (electrons) flow, which is formed in the P type diffusion layer 5) below the gate electrode 10 flow into the P type diffusion layer 6 via the P type diffusion layer 5. In this event, if the P type diffusion layers 5 and 6 have large resistance values, there arises a potential difference between the base and the emitter of the parasitic NPN transistor. Accordingly, the parasitic NPN transistor performs an ON operation.

Therefore, as described above, the P type diffusion layer 6 is formed below the N type diffusion layer 7 so as to correspond to the shape of the contact hole 15. By use of this structure, the resistance values of the P type diffusion layers 5 and 6 can be reduced. Moreover, by reducing the potential difference between the base and the emitter of the parasitic NPN transistor, the ON operation of the parasitic NPN transistor can be prevented. As a result, a safe operation region of the MOS transistor 1 can be expanded.

Next, with reference to FIGS. 3 to 8, detailed description will be given for a method of manufacturing the semiconductor device according to the embodiment of the present invention. FIGS. 3 to 6A, 7 and 8 are cross-sectional views showing the method for manufacturing the semiconductor device according to this embodiment. FIG. 6B is a plan view showing the method for manufacturing the semiconductor device according to this embodiment. Note that, in the following description, the case where an N-channel MOS transistor, for example, is formed in one of element formation regions separated by isolation regions is described. However, the embodiment of the present invention is not limited to the case described above. For example, a P-channel MOS transistor, an NPN transistor, a vertical PNP transistor and the like may be formed in other element formation regions to form a semiconductor integrated circuit device.

Figure 3:
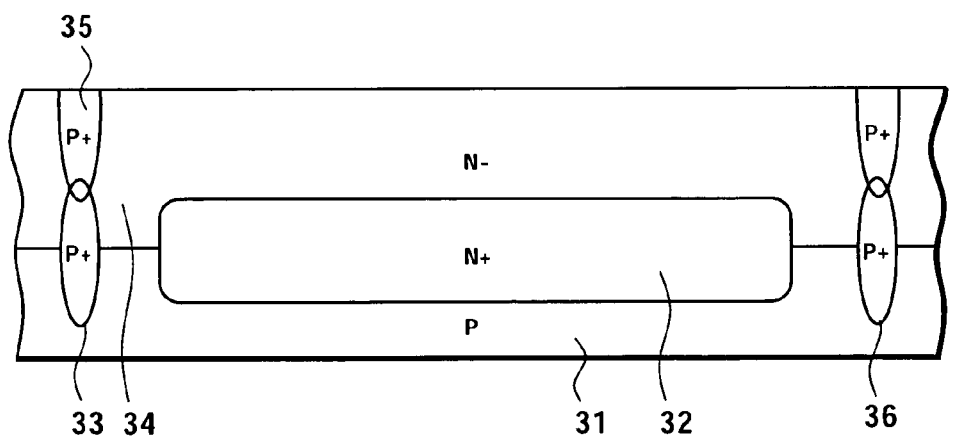
FIG. 3 is a cross-sectional view showing a method for manufacturing a semiconductor device according to the embodiment of the present invention.

First, as shown in FIG. 3, a P type single crystal silicon substrate 31 is prepared. Thereafter, by use of the heretofore known photolithography technology, N type impurities, for example, phosphorus (P) ions are implanted from a surface of the substrate 31 to form an N type buried diffusion layer 32. Next, by use of the heretofore known photolithography technology, P type impurities, for example, boron (B) ions are implanted from the surface of the substrate 31 to form a P type buried diffusion layer 33. Thereafter, the substrate 31 is placed on a susceptor of an epitaxial growth apparatus. Subsequently, a high temperature of about 1200° C., for example, is applied to the substrate 31 by lamp heating and, at the same time, $SiHCl_3$ gas and $H_2$ gas are introduced into a reaction tube. By this step, an epitaxial layer 34 having a specific resistance of 0.1 to 2.0 Ω·cm and a thickness of about 1.0 to 10.0 μm, for example, is grown on the substrate 31.

Thereafter, by use of the heretofore known photolithography technology, P type impurities, for example, boron (B) ions are implanted from the surface of the epitaxial layer 34 to form a P type diffusion layer 35. When the P type buried diffusion layer 33 and the P type diffusion layer 35 are connected to each other, an isolation region 36 is formed. As described above, the substrate 31 and the epitaxial layer 34 are separated into a plurality of island regions by the isolation regions 36.

Note that each of the substrate 31 and the epitaxial layer 34 in this embodiment corresponds to a "semiconductor layer" of the present invention. Although the case where one epitaxial layer 34 is formed on the substrate 31 is described in this embodiment, the present invention is not limited thereto. For example, as the "semiconductor layer" of the embodiment of the present invention, only the substrate may be used or the plurality of epitaxial layers may be laminated on the substrate. Moreover, the substrate may be the N type single crystal silicon substrate or the compound semiconductor substrate.

Figure 4:
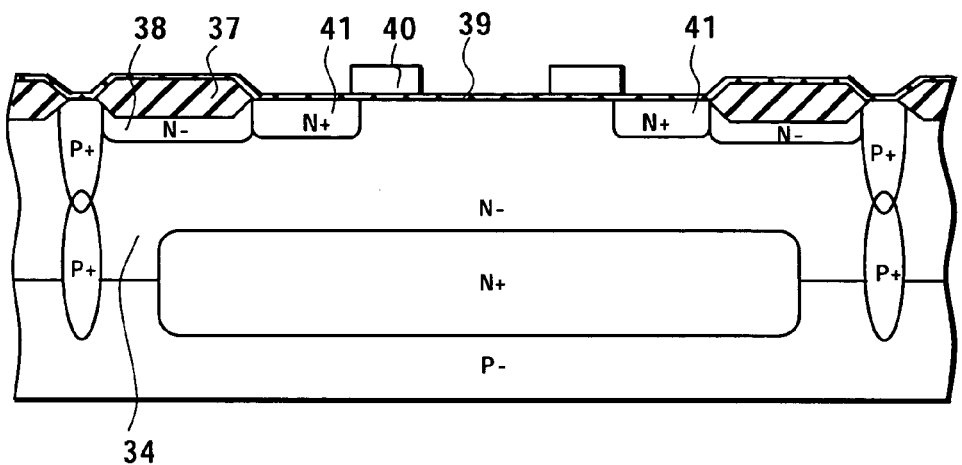
FIG. 4 is a cross-sectional view showing the method for manufacturing a semiconductor device according to the embodiment of the present invention.

Next, as shown in FIG. 4, by use of an insulating layer having an opening provided in a portion where a LOCOS oxide film 37 is formed, as a mask, N type impurities, for example, phosphorus (P) ions are implanted to form an N type diffusion layer 38. Thereafter, by forming the LOCOS oxide film 37, the N type diffusion layer 38 can be formed with high positional accuracy with respect to the LOCOS oxide film 37. Subsequently, on the epitaxial layer 34, a silicon oxide film 39, a polysilicon film and a tungsten silicon film are sequentially deposited. By use of the heretofore known photolithography technology, the polysilicon film and the tungsten silicon film are selectively removed to form a gate electrode 40. Note that the silicon oxide film 39 below the gate electrode 40 is used as a gate oxide film. Thereafter, N type impurities, for example, phosphorus (P) ions are implanted to form an N type diffusion layer 41. The N type diffusion layer 41 is used as a drain region.

Figure 5:
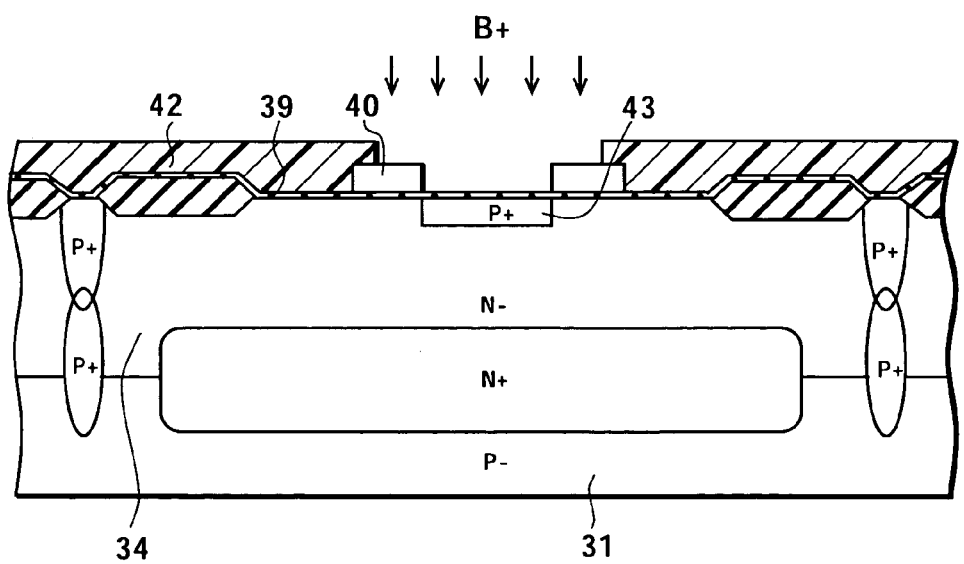
FIG. 5 is a cross-sectional view showing the method for manufacturing a semiconductor device according to the embodiment of the present invention.

Next, as shown in FIG. 5, a photoresist 42 is formed on the epitaxial layer 34. Thereafter, by use of the heretofore known photolithography technology, an opening is formed in the photoresist 42 on a region where a P type diffusion layer 43 is to be formed. Subsequently, P type impurities, for example, boron (B) ions are implanted to form the P type diffusion layer 43.

Figure 6A:
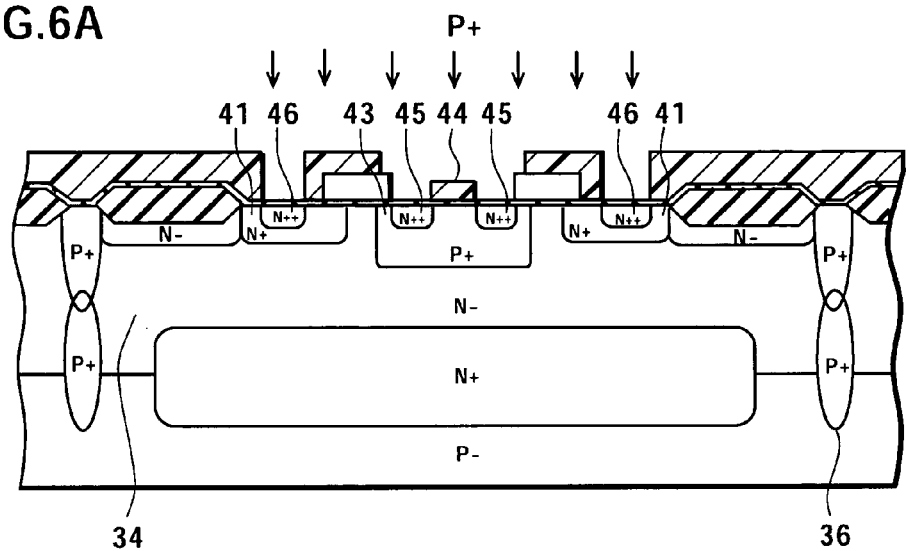
FIG. 6A is a cross-sectional view.
Figure 6B:
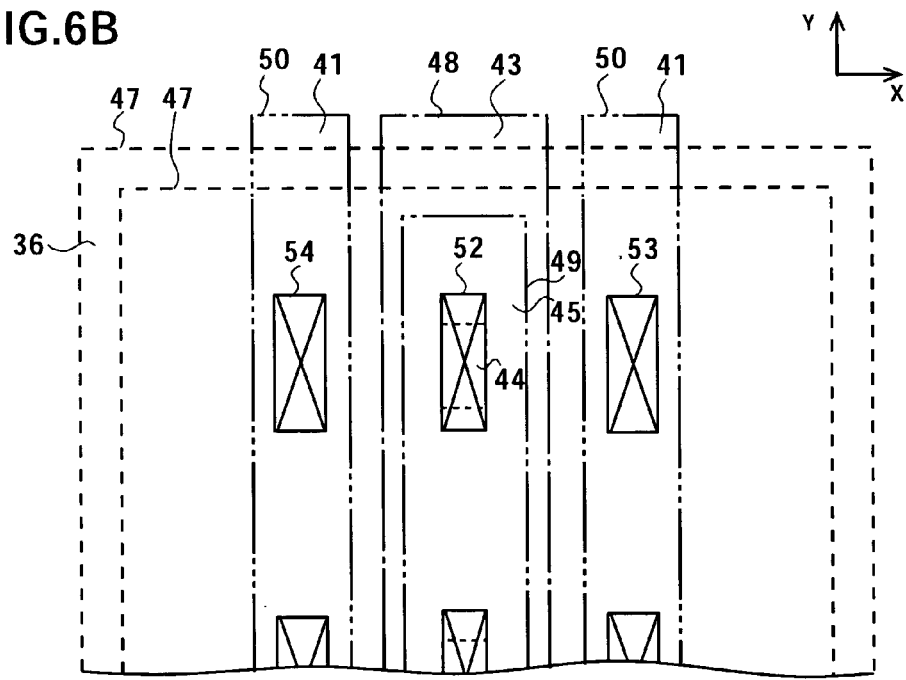
FIG. 6B is a plan view, showing the method for manufacturing a semiconductor device according to the embodiment of the present invention.

Next, as shown in FIG. 6A, a photoresist 44 is formed on the epitaxial layer 34. Thereafter, by use of the heretofore known photolithography technology, N type impurities, for example, phosphorus (P) ions are implanted to form N type diffusion layers 45 and 46. The N type diffusion layer 45 is formed so as to overlap with the P type diffusion layer 43. A region where the N type diffusion layer 45 and the P type diffusion layer 43 overlap with each other becomes an N type diffusion region, in which an N type impurity concentration and a P type impurity concentration are corrected. The N type diffusion region is used as a source region. Meanwhile, the N type diffusion layer 46 is used as the drain region. Accordingly, the drain region has a double diffusion structure including the N type diffusion layers 41 and 46.

Here, FIG. 6B shows a part of a pattern diagram of the MOS transistor. A region surrounded by dotted lines 47 indicates the isolation region 36, a region surrounded by a dashed line 48 indicates the P type diffusion layer 43, a region surrounded by a dashed double-dotted line 49 indicates the N type diffusion layer 45, and a region surrounded by a dashed triplicate-dotted line 50 indicates the N type diffusion layer 41. As shown in FIG. 6B, a part of the P type diffusion layer 43, in which the N type diffusion layer 45 is formed, is covered with the photoresist 44. Note that, as shown in FIG. 6A, the region where the N type diffusion layers 45 and 46 are not formed is covered with the photoresist 44, which is omitted in FIG. 6B.

Thereafter, phosphorus (P) ions are implanted to form the N type diffusion layer 45 in the P type diffusion layer 43, and the photoresist 44 is removed. Specifically, the region where the photoresist 44 is formed on the P type diffusion layer 43 is kept in the state of the P type diffusion layer 43.

Figure 7:
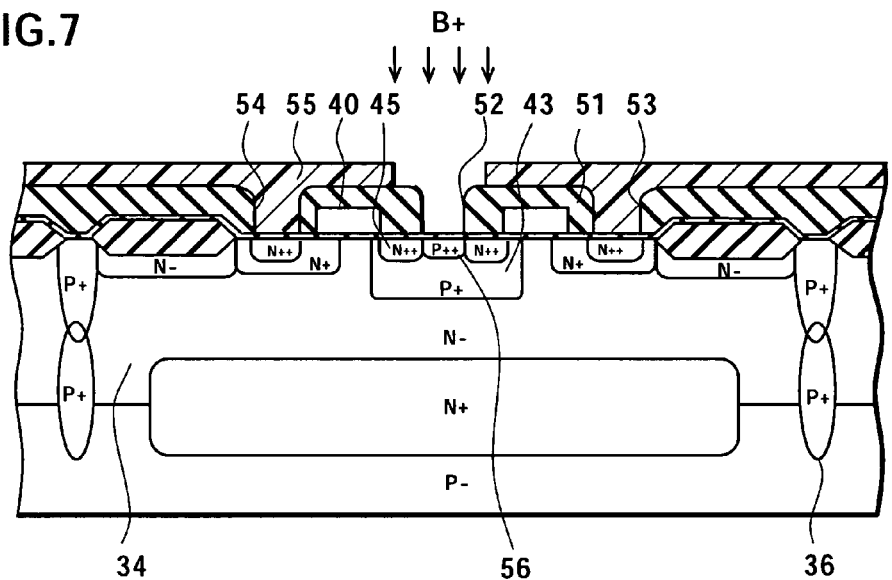
FIG. 7 is a cross-sectional view showing the method for manufacturing a semiconductor device according to the embodiment of the present invention.

Next, as shown in FIG. 7, on the epitaxial layer 34, the BPSG (Boron Phospho Silicate Glass) film, the SOG (Spin On Glass) film or the like, for example, is deposited as an insulating layer 51. Thereafter, by use of the heretofore known photolithography technology, contact holes 52, 53 and 54 are formed in the insulating layer 51, for example, by dry etching using $CHF_3+O_2$ gas.

Thereafter, a photoresist 55 is formed on the insulating layer 51, and the photoresist 55 is selectively removed so as to provide the opening of the contact hole 52. Subsequently, through the contact hole 52, P type impurities, for example, boron (B) ions are implanted into the epitaxial layer 34. In this event, as indicated by the solid line in FIG. 6B, the contact hole 52 is formed. In an opening region of the contact hole 52, the N type diffusion layer 45 and the P type diffusion layer 43 surrounded by the N type diffusion layer 45 are positioned. Thus, boron (B) injected through the contact hole 52 forms a P type diffusion layer 56 in the P type diffusion layer 43. Meanwhile, boron (B) injected into the N type diffusion layer 45 in the contact hole 52 is kept in the state of the N type diffusion layer 45 by correction of the N type impurity concentration and the P type impurity concentration.

Specifically, by using the contact hole 52, the P type diffusion layer 56 is formed by performing ion implantation twice. In formation of the P type diffusion layer 56, the first ion implantation of boron (B) is performed under conditions of, for example, an acceleration voltage of 40 to 60 keV and a dose of $1.0 \times 10^{14}$ to $1.0 \times 10^{16}/cm^2$. The second ion implantation of boron (B) is performed under conditions of, for example, the acceleration voltage of 70 to 90 keV and a dose of $1.0 \times 10^3$ to $1.0 \times 10^{15}/cm^2$.

In other words, under the conditions of the first ion implantation, the P type diffusion layer 56 is not formed in the region overlapping with the N type diffusion layer 45. Under the conditions described above, the source electrode can be connected to both of the N type diffusion layer 45 and the P type diffusion layer 56 through the contact hole 52. Moreover, a base potential and an emitter potential in the parasitic NPN transistor described above can be set to the same potential. Meanwhile, in the second ion implantation, the acceleration voltage is set higher than that in the first ion implantation, and boron (B) is injected into a deep portion of the epitaxial layer 34. Under the conditions described above, the P type diffusion layer 56 is formed so as to correspond to the shape of the opening of the contact hole 52 below the N type diffusion layer 45. Moreover, resistance values of the P type diffusion layers 43 and 56 are reduced, and, as described above, a potential difference between the base and the emitter of the parasitic NPN transistor is reduced. Thus, an ON operation of the parasitic NPN transistor can be prevented. Furthermore, by performing the ion implantation twice, an impurity concentration in a surface region of the P type diffusion layer 56 can also be controlled. Accordingly, contact resistance can also be reduced. Note that, by heat treatment in other steps after the ion implantation steps of forming the P type diffusion layer 56, the P type diffusion layer 56 is somewhat laterally diffused from the shape of the opening of the contact hole 52.

Moreover, by use of this manufacturing method, performing the ion plantation twice makes it possible to form the P type diffusion layer 56 corresponding to the formation position of the contact hole 52. Thus, it is made possible to omit the step of forming the P type diffusion layer 56 before formation of the contact hole 52. Therefore, it is not required to take account of mask misalignment at the time of formation of the P type diffusion layer 56, and the impurity concentration of the P type diffusion layer 43 positioned below the gate electrode 40 is not increased. As a result, modulation of a Vth value of the MOS transistor can be prevented.

Furthermore, by utilizing the contact hole 52 at the time of the ion implantation step of forming the P type diffusion layer 56, it is not required to take account of mask misalignment between the P type diffusion layer 56 and the contact hole 52. For example, in the case where the contact hole 52 is formed after the P type diffusion layer 56 is formed, a mask misalignment width of about 0.6 (μm) is required around the contact hole 52, in addition to the width of the contact hole 52. However, in this embodiment, it is not required to take account of the mask misalignment width. In the cross section shown in FIG. 7, it is made possible to omit mask misalignment widths (about 1.2 μm) which are considered to be on the left and right of the contact hole 52. Accordingly, a size of the MOS transistor can be reduced.

Furthermore, in the ion implantation step of forming the P type diffusion layer 56, the insulating layer 51 is used as a mask to form the P type diffusion layer 56. For this reason, compared with the case where a photoresist is used as a mask, the mask near the opening does not go slack from the dose of the impurities, and a large dose of impurities can be used in the first ion implantation step. By use of this manufacturing method, in the second ion implantation, although the acceleration voltage is set higher than that in the first time, channeling can be suppressed. This is because an amorphous through film is formed on the surface of the epitaxial layer 34 with the first ion implantation step using a low acceleration voltage.

Note that the P type diffusion layer 56 in this embodiment corresponds to the "back gate draw-out region" of the present invention.

Figure 8:
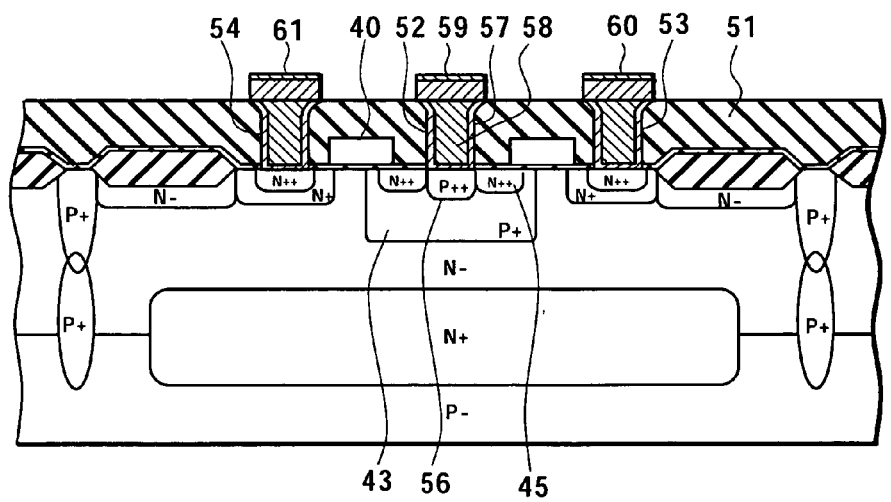
FIG. 8 is a cross-sectional view showing the method for manufacturing a semiconductor device according to the embodiment of the present invention.

Lastly, as shown in FIG. 8, barrier metal films 57 are formed on inner walls of the contact holes 52, 53 and 54, and the like. Thereafter, tungsten (W) films 58 are buried in the contact holes 52, 53 and 54. On surfaces of the tungsten films 58, aluminum-silicon-copper (Al—Si—Cu) films and barrier metal films are deposited by use of a CVD method. Thereafter, by use of the heretofore known photolithography technology, the aluminum-silicon-copper films and the barrier metal films are selectively removed to form a source electrode 59 and drain electrodes 60 and 61. Note that, although a wiring layer for the gate electrode is not shown in the cross-sectional view of FIG. 8, the electrode is connected to the wiring layer in other regions.

Note that, in this embodiment, the description has been given for the case where the P type diffusion layer 56 is formed by utilizing the contact hole 52 after the N type diffusion layer 45 is formed in the P type diffusion layer 43 and the contact hole 52 is formed. However, the embodiment of the present invention is not limited to the case described above. For example, the contact hole 52 may be formed after the N type diffusion layer 45 is formed in the P type diffusion layer 43 and the P type diffusion layer 56 is formed by using a photoresist as a mask. Also in this case, the P type diffusion layer 56 can be formed in a desired region. Moreover, the operation of the parasitic NPN transistor in the MOS transistor can be suppressed.

Moreover, in this embodiment, the description has been given for the case where the P type diffusion layer 56 is formed by performing the ion implantation twice each with a different acceleration voltage through the contact hole 52. However, the embodiment of the present invention is not limited to the case described above. For example, the P type diffusion layer 56 may be formed by performing the ion implantation more than once, such as three times and four times, through the contact hole 52. Besides the above, various changes can be made without departing from the scope of the embodiment of the present invention.

What is claimed is:

1. A semiconductor device comprising:
   a semiconductor layer;
   a drain region, a source region and a back gate region, which are formed in the semiconductor layer;

a gate oxide film formed on the semiconductor layer;
a gate electrode formed on the gate oxide film;
an insulating layer formed on the semiconductor layer; and
a contact hole formed in the insulating layer on any of the drain region, the source region and the gate electrode,
wherein a back gate draw-out region is formed in the back gate region, the back gate draw-out region is formed in a portion deeper than the source region, and the back gate draw-out region positioned deeper than the source region is formed across a whole opening region of the contact hole at least on the source region.

2. The semiconductor device according to claim 1, wherein, as for the back gate draw-out region, the region positioned deeper than the source region is formed across a wider region than a region surrounded by the source region.

3. The semiconductor device according to claim 1, wherein the source region is formed to have a depth of not more than 1.0 μm from a surface of the semiconductor layer, and the back gate draw-out region is formed to have a depth of not more than 1.5 μm from the surface of the semiconductor layer.

* * * * *